(12) United States Patent
Hirayanagi et al.

(10) Patent No.: US 7,433,017 B2
(45) Date of Patent: Oct. 7, 2008

(54) METHOD OF MEASURING THE POSITION OF A MASK SURFACE ALONG THE HEIGHT DIRECTION, EXPOSURE DEVICE, AND EXPOSURE METHOD

(75) Inventors: Noriyuki Hirayanagi, Tokyo (JP); Keiichi Tanaka, Tokyo (JP)

(73) Assignee: Nikon Corporation, Tokyo (JP)

( * ) Notice: Subject to any disclaimer, the term of this patent is extended or adjusted under 35 U.S.C. 154(b) by 156 days.

(21) Appl. No.: 11/312,389

(22) Filed: Dec. 21, 2005

(65) Prior Publication Data
US 2006/0187456 A1 Aug. 24, 2006

(30) Foreign Application Priority Data
Dec. 22, 2004 (JP) .............................. 2004-370393

(51) Int. Cl.
*G03B 27/42* (2006.01)
(52) U.S. Cl. .......................................... 355/53; 378/34
(58) Field of Classification Search .................. 355/53, 355/67, 71, 72, 75; 378/34, 35
See application file for complete search history.

(56) References Cited

U.S. PATENT DOCUMENTS

| | | | |
|---|---|---|---|
| 5,502,311 A | 3/1996 | Imai et al. | |
| 5,633,721 A | 5/1997 | Mizutani | |
| 5,801,835 A | 9/1998 | Mizutani | |
| 6,452,661 B1 | 9/2002 | Komatsuda | |
| 6,526,118 B2 | 2/2003 | Komatsuda et al. | |
| 6,727,980 B2* | 4/2004 | Ota et al. ................... | 355/55 |
| 2005/0052633 A1* | 3/2005 | Mori et al. ................ | 355/53 |

* cited by examiner

*Primary Examiner*—Della J. Rutledge
(74) *Attorney, Agent, or Firm*—Finnegan, Henderson, Farabow, Garrett & Dunner L.L.P.

(57) ABSTRACT

A method to measure the height-direction position of a mask M in an exposure device having a function to irradiate the mask M with light emitted from a light source and transfer a pattern formed on the mask M onto a photosensitive substrate such as a wafer by a projection optical system, a mask surface height-direction position measurement method characterized by moving, before measuring the height-direction position of the mask M, an exposure area defining member 1 which is arranged between the mask M and the projection optical system and defines an exposure area at the time of exposure.

20 Claims, 6 Drawing Sheets

METHOD OF MEASURING THE POSITION OF A MASK SURFACE ALONG THE HEIGHT DIRECTION, EXPOSURE DEVICE, AND EXPOSURE METHOD

FIELD OF THE INVENTION

The present invention relates to a method of measuring the position of a mask surface along the height direction ("height direction" in the present specification and the claims means the direction perpendicular to the surface of a mask attached in the normal position) in an exposure device using a mask, an exposure device, and an exposure method.

BACKGROUND OF THE INVENTION

Recently, projection lithography technology has been developed which employs the EUV (Extreme Ultra Violet) light of shorter wavelengths (11~14 nm) than those of conventional UV light in order to improve the resolution of optical systems limited by the diffraction limit of light accompanying the increasing fineness of semiconductor integrated circuits. In this wavelength range, transmission/refraction-type optical elements such as conventional lenses cannot be used, and optical systems utilizing reflection are used. Also, reflection-type masks are used as the masks.

Figure 6A:
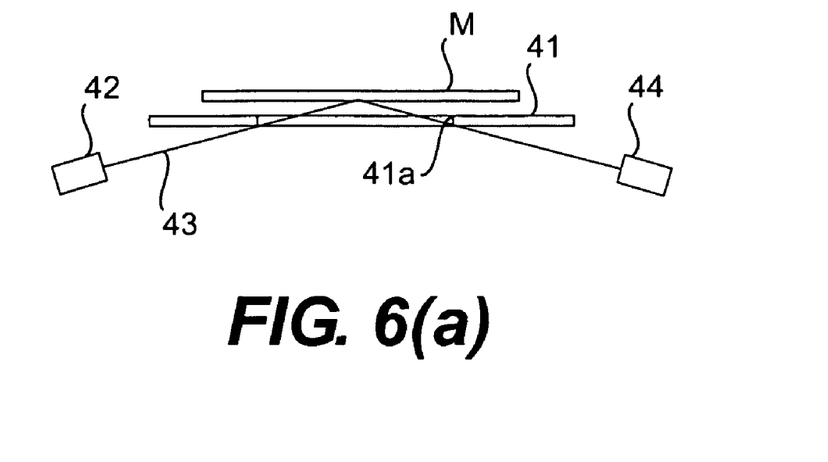
FIGS. 6(a) and 6(b) are diagrams showing problems in the auto-focus control in a conventional EUV exposure device.
Figure 6B:
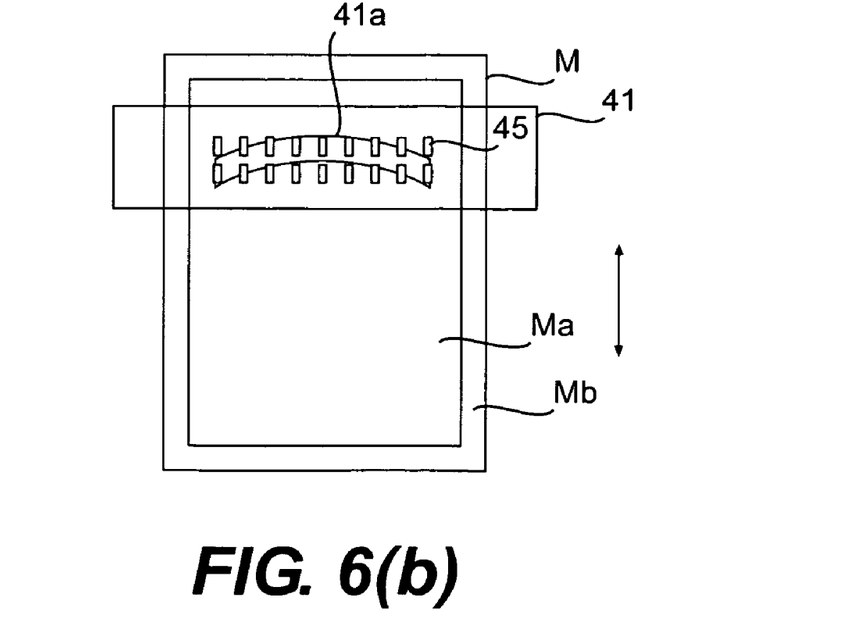

As shown in FIG. 6, arranged in front of a mask is a slit substrate 41 having an arc-shaped opening 41a in proximity to a mask M. At the time of exposure, the mask M attached to a mask stage moves as indicated by an arrow, so that patterns formed on the mask surface are illuminated one after another. Note that in FIG. 6, (a) is a side view (scanning direction of the mask M) of the mask M and the slit substrate 41, and (b) is a view of the mask M and the slit substrate 41 from the slit substrate 41 side. The mask M has a pattern region Ma where patterns are formed, and a peripheral region Mb which surrounds the pattern region and has no pattern.

On the other hand, the mask surface is not always flat, and also when the mask is attached to the mask stage, the height-direction position may change, or it may be attached in an inclined state. In such cases, the distance between the mask and the projection optical system changes, by which problems may occur in image-forming performance, such as a blurred image when exposure is performed on a wafer, and errors in magnification or transfer position.

In order to prevent such problems, it is necessary to measure the height-direction position of the mask so that no problem should occur in image-forming performance.

Measurement of the height-direction position of each part of the mask is performed by emitting light from an oblique direction onto a measured surface of the mask and observing the position where light reflected by the mask surface enters a receiving surface, because the observed light incident position changes if the height of the measured surface of the mask changes, the height of the measured surface of the mask can be measured.

However, when attempting to measure the height-direction position of the exposure surface of a mask during an exposure time by the optical method in an EUV exposure device having the slit substrate, there is the problem that the slit substrate becomes an obstacle. In FIGS. 6(a) and 6(b) when measuring the height-direction position of the mask M surface, as shown in FIG. 6(a), light 43 is emitted from a light source 42, and the position of light reflected by the mask M surface is observed by a photo-detector 44. Although only one beam of light 43 is shown in FIG. 6(a), in actuality multiple slit images 45 are formed as shown in FIG. 6(b), which multiple height-direction positions are simultaneously measured.

However, when the slit substrate 41 exists, the light is obstructed by the slit substrate 41 and does not reach the mask M surface. Namely, as shown in (b), among the slit images 45 (shown in the figure are 9×2 slit images as an example), although some of them pass through the opening 41a of the slit substrate 41 and reach the mask M surface, others are obstructed by the slit substrate 41 and do not reach the mask M surface, in which state the height-direction position of the mask M surface cannot be measured.

Although the above explanation was made regarding a method of measuring the height of the mask M surface using light, also in the case of using height measurement devices of a contact type or non-contact type where other principles such as electrostatic capacity, eddy current, and ultrasound are applied, problems may occur in which measurement is made impossible by the existence of a slit substrate 41 or the measurement data do not satisfy a specified accuracy. Also, even in the case of using a transmission mask is used instead of a reflection mask, various problems occur when an exposure area defining member such as a slit substrate which defines an exposure area is used between the mask and the projection optical system.

SUMMARY OF THE INVENTION

The present invention has been made considering such a situation, and has an objective of providing a method which allows measurement of the height-direction positions of a mask surface even in an exposure device which has between its projection optical system and the mask an exposure area defining member which defines an exposure area, and an exposure method in an exposure device using this measurement data.

The first means to solve these problems is a method to measure the height-direction position of a mask in an exposure device which has a function to emit light from a light source onto the mask and transfer a pattern formed on the mask onto a photosensitive substrate such as a wafer using a projection optical system, a mask surface height-direction position measurement method characterized by moving, before measuring the height-direction position of the mask, an exposure area defining member which is placed between the mask and the projection optical system and defines the exposure area at the time of exposure.

In the present means, an exposure area defining member such as a slit substrate is moved when measuring the height-direction position of a mask surface, by which, even if there is an exposure area defining member, because the exposure area defining member can be withdrawn, the height-direction position of a specified part of the mask surface can be measured. If the height-direction position of the specified part of the mask surface corresponding to this position is measured and stored before exposure, the mask surface height corresponding to the scan-direction position can be known by measuring the scan-direction position of the mask during exposure. For example, by using this information, the height-direction position error can be corrected. The reference plane is usually set with the projection optical system as the reference.

The second means to solve the problems is characterized by the fact that, as the first means, the exposure area defining member is fixed in its position at the time of exposure.

Because the exposure area defining member is fixed in its position at the time of exposure but it is moved to a position which does not deteriorate the measurement before the measurement, it is possible to measure the height direction position of the mask.

The third means to solve the problem is characterized by the fact that as the first means ant the second means, the exposure area defining member is moved to a position which does not obstruct the function of the height measurement device before its measurement.

Because the exposure area defining member is moved to a position which does not obstruct the function of the height measurement device, it becomes possible to perform height measurement well.

The fourth means to solve the problems is characterized by the fact that, as the third means, the relative position between the mask and the exposure area defining member is varied intermittently to perform measurement of the height-direction position of the mask surface.

In this means, instead of retreating an exposure area defining member such as a slit substrate, by shifting by a small amount the relative position between the mask and the exposure area defining member so as not to obstruct the function of the height measurement device, measurement of the mask surface is possible. Therefore, there is no need to move the mask substrate by a large amount. Because the region of the mask surface which can be measured by this method is limited, measurement is performed by changing the measurement position by moving the mask stage intermittently.

The fifth means to solve the problem is characterized by the fact that, as one of the first means through fourth means, the exposure area defining member has an opening through which exposure light can be transmitted, through which the height-direction position measurement is performed.

In this means it is possible to perform height-direction position measurement through the opening.

The six means to solve the problems is characterized by the fact that, as one of the first means through third means, height-direction position measurement of the mask surface is performed while moving a mask stage which supports the mask.

In this means, because measurement is performed as the mask stage is moving while performing the height-direction position of the mask surface, it can be done with a fixed height measurement device. Also, the mask stage usually has a scan-direction position measurement device using an interferometer, the scan-direction position of the mask can be detected using this scan-direction position measurement device.

The seventh means to solve the problems is characterized by the fact that, as one of the first means through sixth means, the exposure area defining member is a slit substrate.

The eighth means to solve the problems is characterized by the fact that, as one of the first means through seventh means, measurement of the height-direction position of the mask is performed using an optical measurement device which has a light source for measurement and a detector which detects a light flux emitted from the light source for measurement and which is reflected by the mask.

When an optical measurement device is used, there are advantages of high precision, high stability, few restrictions about measurement objects, non-contact, and high speed.

The ninth means to solve the problems is characterized by the fact that, as one of the first means through eighth means, at the same time of measuring the height-direction position of the mask surface, the height-direction position of the mask stage is measured, and the measured height-direction position of the mask surface is corrected with the measured height-direction position of the mask stage.

In using the first means through eighth means, variation of the height-direction position of the mask accompanying the scanning of the mask stage becomes a problem. Namely, there is no problem if the height-direction position of the mask stage is the same between the time of measuring the height-direction position of the mask surface and the time of exposure. If there is a difference between them, there occurs an error in the position of the mask surface relative to the projection optical system.

In this means, at the same time of measuring the height-direction position of the mask surface, the height-direction position of the mask stage from the reference plane is measured, and the measured height-direction position of the mask surface is corrected by the measured height-direction position of the mask stage. Therefore, even when the height-direction position of the mask stage is different between the measurement time and the exposure time, correct exposure becomes possible by a height correction based on the height-direction position of the mask stage measured at the time of exposure.

This height correction includes a method which corrects the mask stage position itself, a method which corrects the position of a photosensitive substrate stage such as wafer, and a method which corrects the positions of mirrors and/or lenses of the projection optical system, etc. Namely, while the height-direction deviation of the mask stage can be corrected by correcting the mask stage itself, and because the deviation is a variation of the image-forming position, it may be any other method which can adjust the image-forming position, adjusting the position of the photosensitive substrate stage or the projection optical system can adjust the image-forming position in the same way. Height correction mentioned in this specification and claims means any method which can perform such image-forming position correction.

The tenth means to solve the problems is characterized by the fact that, as one of the first means through ninth means, the height-direction position of a no pattern region, which surrounds a pattern region, is measured.

When attempting to measure the height-direction position of the mask surface, there are cases where roughness of a pattern formed on the mask becomes a problem. Namely, there is a possibility that measured data contain errors due to the roughness of the mask surface because of an existence of a pattern.

As stated above, because the mask has a peripheral region with no pattern surrounding a pattern region, in this means the height-direction position of the mask surface in this peripheral region is measured.

For example, if swells of the mask surface are relatively small and almost only the height and inclination of the whole mask are the issue, the height and inclination of the whole mask can be known by this means, and based on them the height can be corrected.

The eleventh means to solve the problems is characterized by the fact that, as one of the first means through tenth means, the exposure area defining member returns to a position to define an exposure area at the time of exposure.

In the exposure state, the exposure area defining member defines a region so that only a region to be exposed is irradiated with exposure light and other regions are not irradiated with exposure light. The position to define an exposure area is a position where such a function is performed. In this means, because the exposure defining member returns to the position to define an exposure area, exposure is applied to the correct exposure area.

The twelfth means to solve the problems is, as a method to measure the height-direction position of a mask in an exposure device having a function to irradiate a mask with light emitted from a light source and transfer a pattern formed on the mask to a photosensitive substrate such as a wafer, a mask surface height-direction position measurement method characterized by the fact that a mask stage height position measurement device which measures the height-direction position of a mask stage which holds the mask is provided, and the height-direction position of the mask surface is obtained from data measured by the mask stage height position measurement device.

In general, a mask stage has position measurement devices such as a length measuring interferometer for measuring the position of the stage along the scan direction of the mask stage and along a direction perpendicular to the scan direction of the mask stage inside the mask stage plane. In this means, a similar measurement device is provided for measuring the height-direction position of the mask stage, by using measurement data the height-direction position of the mask surface is measured. This method is effective in cases where swelling on the mask surface is not large enough to become an issue and variation in the attaching precision of the mask to the mask stage is small. Note that a mask stage height position measurement device such as the one used in this means can be used also in measuring the height of a mask stage by other means.

The thirteenth means to solve the problems is, in an exposure device which has a function to irradiate a mask with light emitted from a light source and transfer a pattern formed on the mask on a photosensitive substrate such as a wafer using a projection optical system, and has an exposure area defining member which defines an exposure area at the time of exposure between the projection optical system and the mask, a mask surface height-direction position measurement method characterized by the fact that the height-direction position measurement of the mask surface is performed at a position in which the function of the height measurement device is not obstructed by the exposure area defining member.

By this means, the height-direction position measurement of the mask surface is performed at a position in which the function of the height measurement device is not obstructed by the exposure area defining member. So, it is not necessary to move an exposure area defining member such as a slit substrate. In this case, the position of the mask to measure the height direction is different from the position of an incident exposure light on the mask but these scan position differences can be corrected by mask stage scan direction position data measured by scan direction position measurement device which is provided in the mask stage.

The fourteenth means to solve the problems is, as an exposure device which exposes a mask with light emitted from a light source and transfers a pattern formed on the mask onto a photosensitive substrate such as a wafer using a projection optical system, an exposure device characterized by having an exposure area defining member which is arranged between the mask and the projection optical system and defines an exposure area at the time of exposure, a means to measure height-direction positions of mask surface by the mask surface height-direction position measurement method described in one of the first means through thirteenth means, and then performs height correction at the time of exposure based on the measured height-direction position data of the mask surface.

By this means, because the height correction is made based on measured height-direction position of the mask surface, image blurring caused by variation in the height-direction position of the mask surface can be reduced.

The fifteenth means to solve the problems is, as an exposure method using the fourteenth means, an exposure method in an exposure device characterized by the fact that the height correction means has a means to measure the height-direction position from the reference plane of the mask stage at the time of exposure, and height correction is performed based on data on measured height-direction position of mask surface and the height-direction position of the mask stage measured at the time of exposure.

In this means, because the height correction is made based on data on measured height-direction position of mask surface and the height-direction position of the mask stage measured at the time of exposure, image blurring caused by variation in the height-direction position of the mask surface can be reduced precisely even when the height-direction position is different between the measurement time and the exposure time.

The sixteenth means to solve the problems is, as an exposure device which exposes a photosensitive substrate such as a wafer with a reflection mask pattern via a projection optical system, an exposure device characterized by having a measurement means to measure the height-direction position of the reflection mask, a measurement means to measure the height-direction position of the photosensitive substrate, a means to adjust the height-direction position of the reflection mask based on the measured height-direction position of the reflection mask, and a means to adjust the height-direction position of the photosensitive substrate based on the measured height-direction position of the photosensitive substrate.

In this means, the mask height error is corrected by the mask position, and the photosensitive substrate height error is corrected by the photosensitive substrate position. Namely, height corrections based on height measurements on the mask side and the photosensitive substrate side are made independent from each other. When using a reflection mask, because it is difficult to make the mask side a telecentric optical system, mask height deviation also causes a magnification error. Therefore, if mask deviation is corrected on the photosensitive substrate side or the photosensitive substrate side error is corrected in the mask side, magnification error occurs, which may become a problem. Because these corrections are independent of each other in this means, it becomes possible to reduce the influence of magnification errors.

The seventeenth means to solve these problem is, as an exposure device which irradiates a mask with light emitted from a light source and transfers a pattern formed on the mask onto a photosensitive substrate such as a wafer using a projection optical system, an exposure device characterized by having a height-direction position measurement means which measures the height-direction position of the mask, an exposure area defining member which is provided between the mask and the projection optical system and defines an exposure area, a movement means which moves the exposure area defining member, and a control means which controls the movement means so as to fix the exposure area defining member at the time of exposure and move the exposure area defining member at the time of measuring the height-direction position.

By this means, before measuring the height-direction position of the mask surface, an exposure area defining member such as a slit substrate which is fixed at the time of exposure is moved, by which even when there is an exposure area defining member, the exposure area defining member can be withdrawn, thus allowing measurement of the height-direction position of a specified part of the mask surface. By measuring and pre-storing the scan-direction position of the mask and the height-direction position of a specified portion of the mask measured at that time, if the scan-direction position of the mask is measured during exposure, the height of the mask surface corresponding to the scan-direction position can be known, and a correction regarding the height-direction error can, for example, be made based on this information.

DETAILED DESCRIPTION OF THE PREFERRED EMBODIMENT

Figure 5:
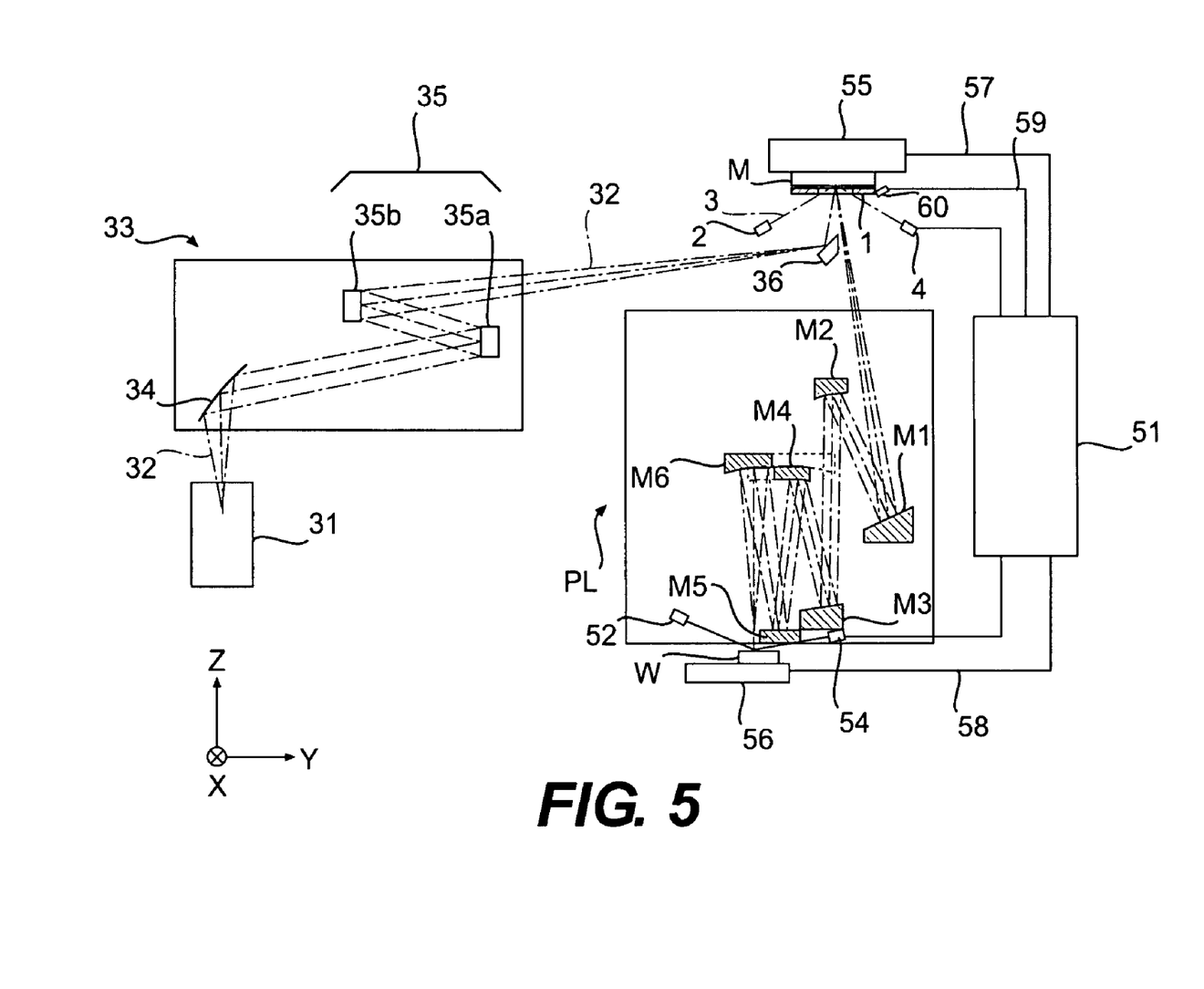
FIG. 5 is a diagram showing an outline of an EUV exposure device by an embodiment of the present invention.

Embodiments of the present invention are explained hereafter, with reference to the drawings. Needless to say, the scope of the present invention is not limited to these embodiments. FIG. 5 is an outline diagram showing an entire EUV exposure device to which the present invention is applicable. EUV light 32 emitted from an EUV light source 31 enters an illumination optical system 33, becomes an approximately parallel light beam by a concave reflecting mirror 34 which acts as a collimator, and enters an optical integrator 35 comprising a pair of a fly-eye mirrors 35a and 35b. As the pair of fly-eye mirrors 35a and 35b, the fly-eye mirrors disclosed in U.S. Pat. No. 6,452,661 can be used for example. Since its constitution and effects are omitted for the convenience of explanation, reference is made to U.S. Pat. No. 6,452,661 for specific details.

In this way, in the vicinity of the reflection plane of the second fly-eye mirror 35b, namely in the vicinity of the exit plane of the optical integrator 35, a substantial extended light source having a specific shape is formed. Light from the substantial extended light source is deflected by a plane reflecting mirror 36, and forms an arc shaped illumination area on a mask M. Light from an illuminated pattern of the mask M forms an image of the mask pattern on a wafer W by a projection optical system PL comprising multiple reflecting mirrors (six reflecting mirrors M1~M6 are shown in FIG. 5 as an example). The mask M is mounted on a mask stage 55 and can be moved in each of the x, y, and z axes directions and rotated around each of the axes. The wafer W is also mounted on a wafer stage 56 and can be moved in each of the x, y, and z axes directions and rotated around each of these axes. Freedom of movement may also be fewer than this. The x and y direction positions of the wafer stage and the mask stage are measured independently by an un-shown interferometer, and the measured data are input to a control device 51. Also, the control device 51 outputs driving signals 57 and 58 to the mask stage 55 and the wafer stage 56, and each stage moves by an un-shown actuator such as a linear motor or an air actuator. Light 3 emitted from a light source 2 comprising a halogen lamp or a laser is reflected by a mask M and measured by a photo-detector 4. The height of the mask M can be measured according to the position of light flux incident to the photo detector 4, and the measurement results output to the control device 51. The details of this height position measurement will be described later. Also, placed immediately below the mask M is an exposure area defining member 1 comprising a slit substrate. The slit substrate 1 can be moved by an actuator 60 such as a linear motor as stated later. A driving signal 59 is input to the actuator 60 from the control device 51, and the slit substrate 1 is moved. A similar height position measurement device to the one on the mask side is placed on the wafer side, light 53 emitted from a light source 52 is reflected by a wafer W and measured by a photo-detector 54. The height of the wafer W can be measured according to the position of light flux incident to the photo-detector 54, and the measurement results output to the control device 51.

Because the mask position variation or the wafer position variation is a relative issue, in a conventional exposure device employing a transmission mask, the mask side and the wafer side heights are measured, and the height-direction position of either the mask side or the wafer side is corrected. Also, if the control responsiveness is sufficient, the height-direction position of an image projected onto the wafer can be corrected by adjusting the position of the optical system (mirrors in this case). Although these correction methods can be adopted in this embodiment as well, in the case of a reflection mask, it is difficult to make the mask side to be a telecentric optical system. Namely, the height-direction position deviation of the mask side can cause errors in magnification variation. Therefore, it is desirable that height-direction position correction of the mask side and the wafer side should be performed independent of each other.

As stated above, the illuminated area in the mask M is in an arc shape. This is for making aberrations such as field curvature determined by the distance from the optical axis almost constant and easier to correct, considering such facts that paraxial rays are not available due to the arrangement of a reflecting mirror of a projection optical system and that it is desired to minimize aberrations over as large an exposure area as possible. Also, in this embodiment, by restricting the illumination light to illuminate the mask M by the slit substrate 1, the illuminated area formed on the mask M is defined into an arc shape. However, because the exposure area exposed with light directed onto the wafer should only be defined in a specified shape after all, it may be constituted so that after the illumination light is reflected by the mask M, the illumination light is restricted by the slit substrate 1. Also, the illumination light may be restricted both before and after reflection by the mask M. As shown in FIG. 5, the principal ray of a light flux incident to the mask enters and is reflected at a specified angle relative to the y-axis direction (horizontal direction of the page). In such a case, if explained using FIG. 1(b), by blocking a light flux with the upper portion of an opening 1a of the slit substrate 1 when a light flux enters the mask, and by blocking a light flux reflected from the mask with the lower portion of the opening 1a at this time, an exposure area is defined in an arc shape. For the lateral direction of the opening 1a, both the incident light flux and reflected light flux are restricted with the same width. When using a transmission mask, a pattern face is placed in the wafer side, and the illumination light which passes the mask is restricted with an exposure area defining member. Note that although the exposure area has an arc shape for the reason in this embodiment, it is not limited to this.

Figure 1A:
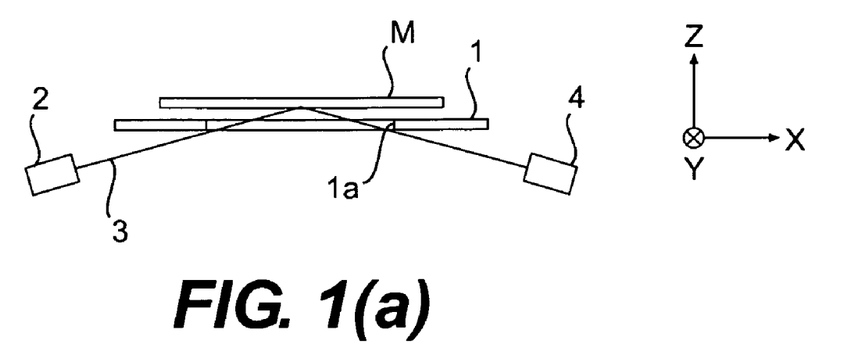
FIGS. 1(a) and 1(b) are diagrams for explaining a height-direction position measurement method of a mask surface which is the first embodiment of the invention.
Figure 1B:
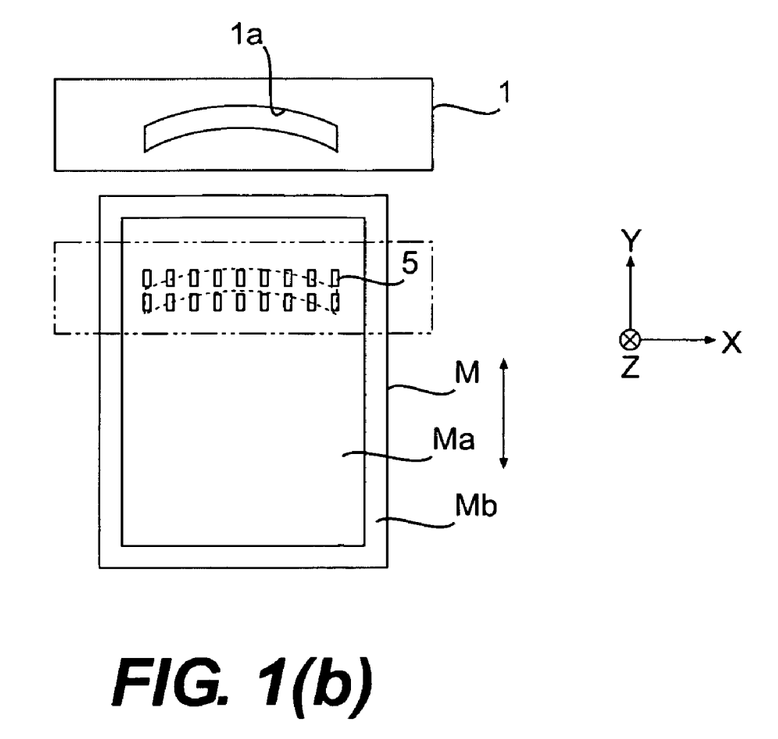

FIGS. 1(a) and 1(b) are diagrams for explaining a mask surface height-direction position measurement method which is the first embodiment of the present invention. This measurement method corresponds to the measurement method explained using FIGS. 6(a) and 6(b).

FIG. 1(a) is a figure showing the vicinity of the mask in FIG. 5, wherein the mask M and the slit substrate 1 are viewed from the side (from the scan direction of the mask M). FIG. 1(b) is a figure wherein the mask M and the slit substrate 1 are viewed from the slit substrate 1 side. 1a is an opening which defines the illuminated area of EUV light at the time of exposure.

In measuring the height-direction position of the mask M surface, as shown in FIG. 1(a), light 3 is emitted from a light source 2, and the position of light reflected by the mask M surface on a photo-detector 4 is observed. As such a method to measure the height-direction position for example, techniques described in U.S. Pat. No. 5801835 and U.S. Pat. No. 5633721 can be used in the present patent. The techniques described in these patents explain the methods for measuring the height-direction position of a wafer surface, and the height-direction position of the mask surface in this example can be measured by a similar method.

For example, because a deviation in the height-direction position of a mask surface can be measured as light flux position deviation on the surface of the photo-detector 4 such as a CCD, the height can be measured based on this light flux position. Note that while only one beam of light 3 is shown in figure (a), in actuality a slit substrate having multiple slits is placed between the light source 2 and a mask substrate, an optical system is placed so that the image of the slit substrate is formed on the mask surface, and further an image-forming optical system is placed so that these slit images are formed on the photo-detector 4. Therefore, the height-direction positions of multiple points on the mask can be simultaneously measured from the positions of the slit images on the photo-detector 4.

In this embodiment, in measuring the height-direction position of the mask surface, as shown in FIG. 1(b) the slit substrate 1 is moved from the proper position indicated by a two-dot chain line to the position where light 3 is not obstructed by a substrate 1 and can reach the mask M surface. The movement direction can be any direction as far as the moving mechanisms to move the slit substrate 1 and the slit substrate 1 does not obstruct the height-direction position measurement.

Therefore, all the images 5 (while in the Figure 9×2 slit images are shown as an example, the interval, the number, and the position arrangement of slit images are not limited to these) of light 3 can reach the mask M surface, and the height-direction positions of the mask M surface can be measured. By measuring at multiple points, even if a height distribution occurs in the x direction due to deflection of the mask for example, the optimal height can be obtained at each position of the scan direction (y direction) of the stage.

By driving the mask stage in this state, the mask M is moved in the arrow direction, and the height-direction position of the mask M surface is measured at a specified interval. The mask stage has a position measurement device which measured the position in the arrow direction and a direction perpendicular to this (right-left direction in the figure), and by taking in these data together, it can be known which position on the mask M surface is at which height.

While in the example shown in FIGS. 1(a) and 1(b), only the pattern region Ma having a pattern is measured, when measuring this region, measurement errors may occur due to the surface roughness by the pattern. In the case of a reflection mask for EUV exposure devices, because an absorber pattern layer may be formed on a multiplayer film, or a pattern to transfer be formed by partially removing a multiplayer film, roughness occurs. In such a case, the height-direction position of a peripheral region Mb having no pattern is simulta-neously measured, and from these data the height-direction position of the mask M and its inclination may be computed. For example, in order to reduce the influence of roughness, there are a method which does not use the height-position data of the mask surface beyond a specified range relative to the height-direction position of the peripheral region Mb, and a method which takes the pattern layer thickness into account for the region beyond a specified range. In order to measure the height-direction position of the peripheral region Mb, it may be arranged so that the slit images 5 shown in FIG. 1(p) are also formed in the peripheral region Mb. In this way, the height-direction positions at each points on the mask M surface can be measured. The measurement results are sent to a control device 51 shown in FIG. 5 and stored. Afterwards, the slit substrate 1 is returned to the original position, and exposure with EUV light is performed. Exposure is performed while the height position and the rotations around the x-axis and the y-axis of the mask stage are being corrected based on the height-direction position data. As stated above, this correction can be also performed by optical system or wafer stage position corrections. Although it is possible to make corrections based only on stored height-direction position data without measuring the height-direction position of the mask during exposure, there is a possibility that the whole stage may shift if compared between the measurement time and the exposure time. Therefore, it is also possible to measure the height of the mask in real time using one or more slit images 5 which can transmit the slit substrate 1a at exposure and perform correction using both the measurement results and previously stored height measurement data.

As a method for measuring the height-direction position of the mask in real time at exposure, the method shown in FIGS. 2(a)- 2(d) can be also used. In the example in FIGS. 2(a)-2(d), a measurement device using an interferometer is placed for measuring the z-direction position of the mask stage, and the height-direction position of the mask stage is measured along with the height-direction position measurement of the mask. Because measurement with an interferometer has high measurement responsiveness and detection accuracy, it is preferred.

In the following figures, there are cases where the same codes are assigned to the same components as the components shown in the previous figure in this column, and their explanations are omitted. In FIGS. 2(a)-2(d), a mask M is held by a mask stage MS. An x-direction position measurement device 11 is provided which uses an interferometer for measuring the x-direction position of the mask stage MS, wherein the x-direction position of the mask stage MS is measured by emitting light 12 onto a reflective mirror attached on an end face of a measurement substrate 13 of the mask stage MS and measuring the phase difference between its reflected light and emitted light (although the same one is provided for the y-direction position measurement, its figure and explanation are omitted.).

Figure 2A:
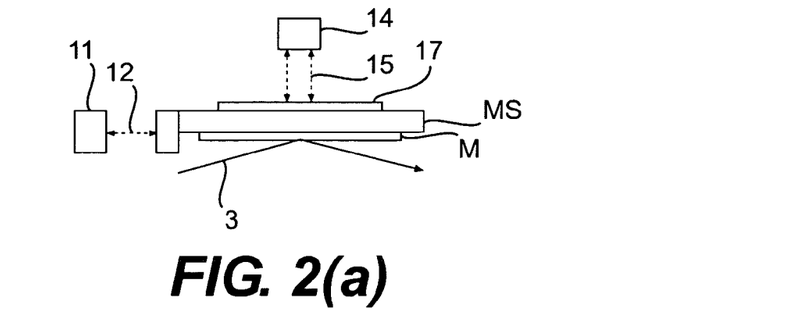
FIGS. 2(a) and 2(b) are diagrams for explaining a method to detect the height-direction position of a mask stage and a method to measure the inclination of a mask stage.

In FIG. 2(a), other than this, a height-measurement device 14 using an interferometer is provided for measuring the z-direction position of the mask stage MS, from which two beams of light 15 are emitted onto a measurement moving mirror 17 attached on the mask stage MS, and the z-direction position of the mask stage is measured with two points in the x direction, By which the z-direction position of the mask stage MS can be measured, and at the same time the inclination of the mask stage MS centering on the y axis can be measured. In the same way, if the z-direction position of the mask stage is measured at two points in the y direction, the inclination of the mask stage MS centering on the x axis can be measured. Conventionally, while the stage positions in the x-axis direction and the y-axis direction are measured at multiple points for measuring the rotations around the x axis and the y axis, because in the example of FIG. 2(a) rotations around the x axis and the y axis can be measured by a z-axis direction height measurement device 14, the constitutions of the x-axis direction and y-axis direction position measurement devices can be simplified, and the length of a moving mirror attached on the stage can be reduced. When using a reflection mask, because the rear space of the mask stage MS has larger room with relatively fewer structural items placed, the position of the moving mirror for measurement 17 can be arranged relatively freely.

Figure 2B:
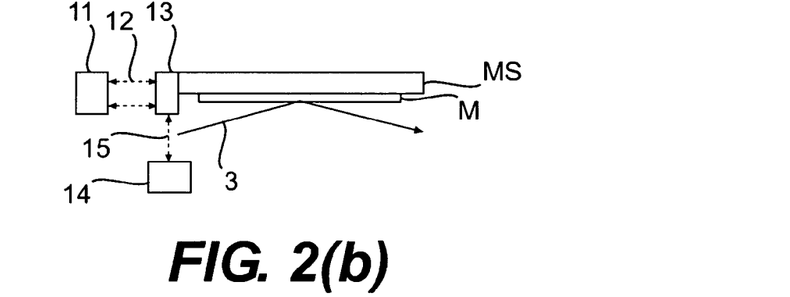

In FIG. 2(b), light 12 emitted from an x-direction position measurement device 11 is made into two beams, and the x-direction position of the side of the moving mirror for measurement 13 is measured at two different points in the z direction. Even doing so, the inclination of the mask stage MS centering on the y axis can be measured. In this case, the height measurement device 14 measures the z-direction position of the mask stage MS at one point by emitting light 15 onto the moving mirror for measurement 13. In this case, because one moving mirror 13 is shared for the use of measuring the x-axis direction position and the z-axis direction position, the device can be made compact and lightweight.

Figure 2C:
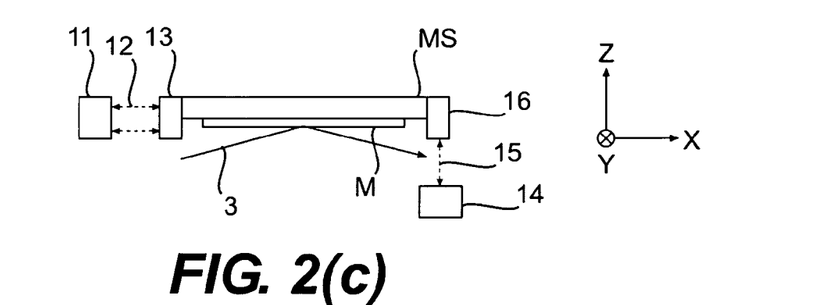

FIG. 2(c) is different from FIG. 2(b) in that a moving mirror for measurement 16 is attached on a separate plane other than that of the moving mirror for measurement 13 of the mask stage MS, and the position of its bottom face is measured by the height measurement device 14. While the moving mirror 13 shown in FIG. 2 (b) has the possibility that the cost becomes high for realizing the face accuracy and perpendicularity between two faces, this example has a relatively low cost because this example employs a commonly-used moving mirror using only one face.

Figure 2D:
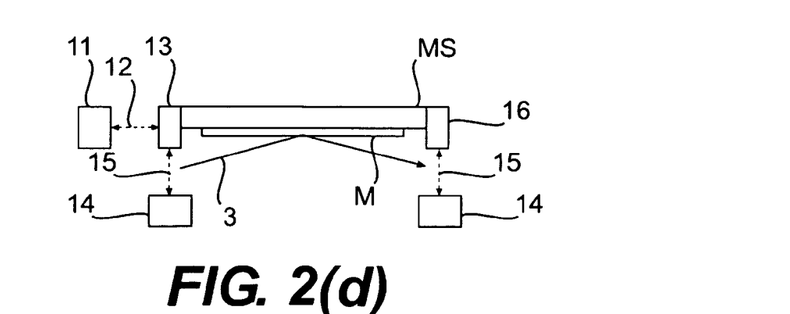

FIG. 2(d) is different from FIG. 2(b) in that light 12 emitted from an x-direction position measurement device 11 is made into one beam, and the bottom faces of both measurement substrates 13 and 16 are measured by a height measurement device 14. In comparison with FIGS. 2(b) and (c), because rotation around the y axis is measured at remote two points, the rotation measurement accuracy is improved. Because height measurement is performed from the projection optical system side in examples in FIGS. 2(b), (c), and (d), it is possible to perform measurements with the projection optical system as the reference, allowing improvement in measurement accuracy.

In this way, when the height-direction position of a mask surface is measured using a mask stage position measurement device, the (three-dimensional) mask stage position and, if necessary, the (three-dimensional) inclination should be measured simultaneously. Then, from the measured values of the mask stage position, the measured mask surface height and the (x-axis direction, y-axis direction) position of its measured point can be corrected.

Then, at the actual exposure also, using the mask stage position measurement device, the (three-dimensional) mask stage position and, if necessary, the (three-dimensional) inclination are measured, from which data and the previously-measured height and measurement point (x-axis direction, y-axis direction) position, the amount of operation is determined for performing correction.

Needless to say, it becomes an equivalent action even if no correction is made for the measured mask surface height and its measured point (x-axis direction, y-axis direction) position, the mask stage position measurement device at that measurement time is stored together with these data, and the amount of operation to perform auto-focusing is determined from the difference in the mask stage position between the measurement time and the exposure time and the measured mask surface height and the measured point (x-axis direction, y-axis direction) position.

While measurements are performed by moving the mask M in the above explanation, alternatively the mask M may be fixed and the measurement device may be moved. Because moving the mask can be generally done using the EUV exposure device, it is preferred to perform measurements by moving the mask M.

Figure 3A:
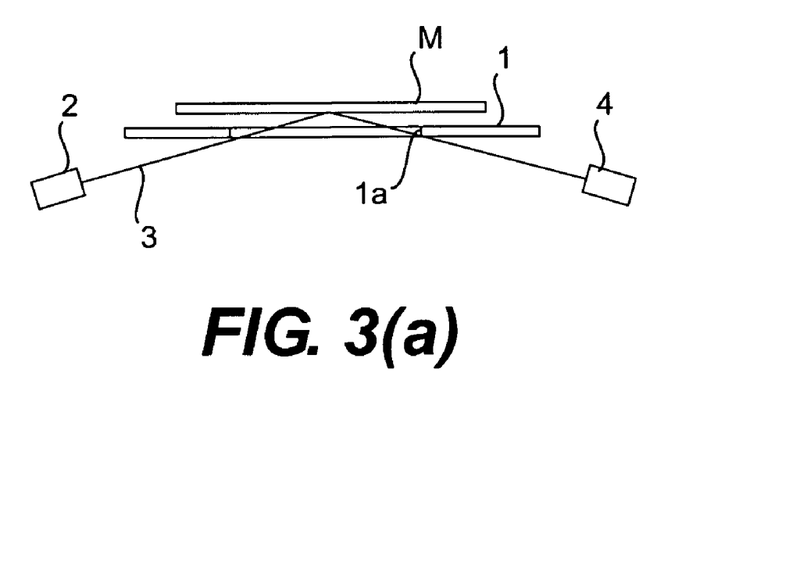
FIGS. 3(a) and 3(b) are diagrams for explaining a height-direction position measurement method of a mask surface which is the second embodiment of the present invention.
Figure 3B:
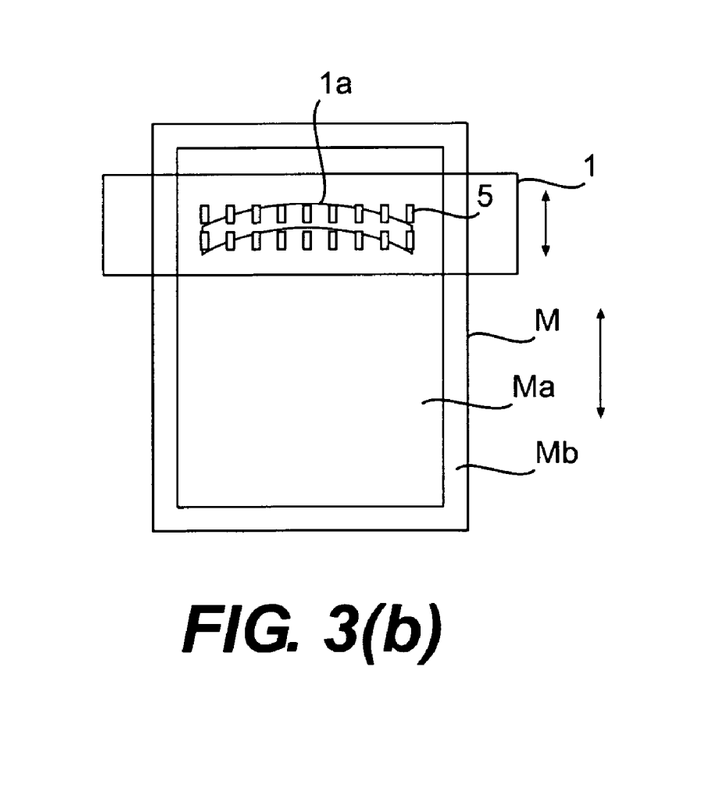

FIGS. 3(a) and 3(b) are diagrams for explaining a height-direction position measurement method of a mask surface which is the second embodiment of the present invention. FIG. 3(a) is a view from the side of the mask M and the slit substrate 1, and FIG. 3(b) is a view of the mask M and the slit substrate 1 from the slit substrate 1 side.

In this embodiment, unlike the first embodiment, the slit substrate 1 is not withdrawn entirely but is shifted by a small amount as shown by the small arrow in FIG. 3(b). Then, some of the multiple slit images 5 reach the mask M surface by passing through an opening 1a. Because which slit images 5 pass through the opening 1a is determined by a geometric relationship according to the shift position of the slit substrate 1, the shift position of the slit substrate 1 is measured, and measurements are done only for the slit images 5 which passed through the opening 1a at that position. This is repeated by shifting the slit substrate 1 until measurements are completed for all of the slit images 5.

Once measurements with all the slit images 5 are finished, the mask M is shifted by a specified amount, and measurement is performed for another place on the mask M surface. In this embodiment, because only a small amount of shift of slit substrate 1 is necessary, there is the advantage that not as much a space as in the first embodiment is needed.

In the embodiment shown above, an explanation was provided on a method to make correction in cases where mask position and/or inclination are different between the time of measuring the mask surface position along the height measurement direction position and the time of exposure. If these are not become a problem considering the mask stage scan accuracy, because the mask position and inclination can be considered the same between the time of measuring the mask surface position along the height measurement direction and the time of exposure, needless to say, the measured data can be used for height correction in their existent state.

Figure 4A:
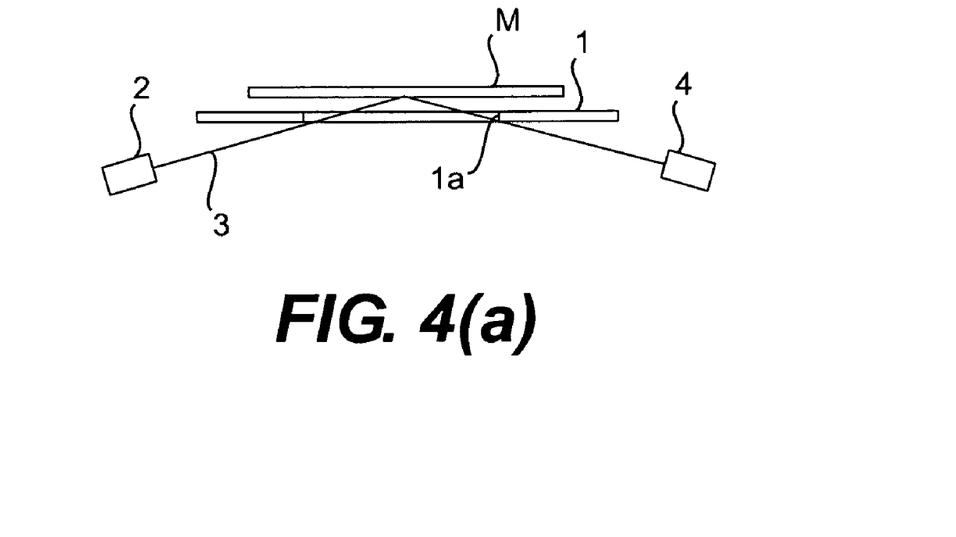
FIGS. 4(a) and 4(b) are diagrams for explaining a height-direction position measurement method of a mask surface which is the third embodiment of the present invention.
Figure 4B:
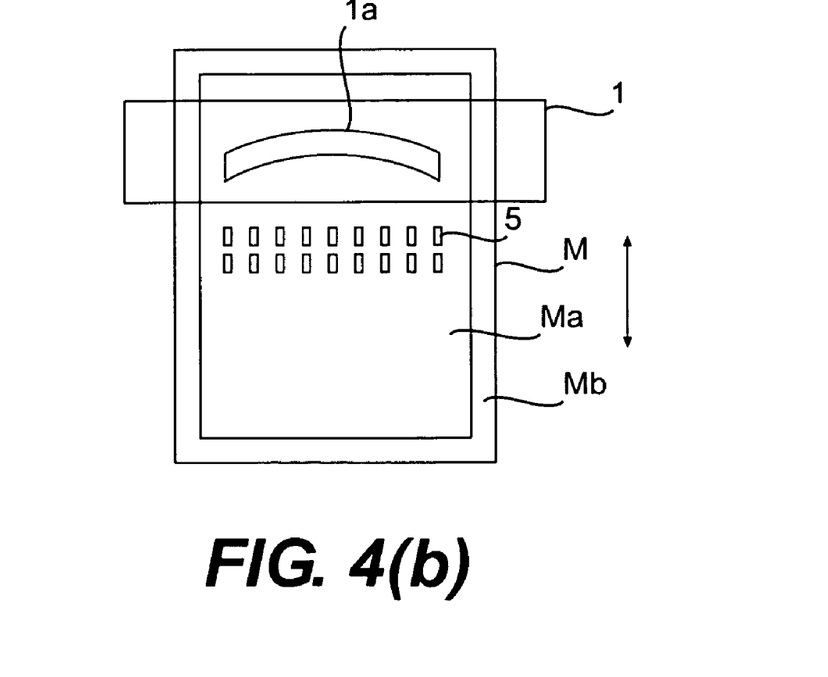

FIGS. 4(a) and 4(b) are diagrams for explaining a method of measuring the mask surface position along the height direction which is the third embodiment of the present invention. FIG. 4(a) is a view of the mask M and the slit substrate 1 from the side (scan direction of the mask M), and FIG. 4(b) is a view of the mask M and the slit substrate 1 from the slit substrate 1 side.

In this embodiment, the height-direction position measurement of the mask surface is performed at a place away from the slit substrate 1. Therefore, the slit substrate 1 does not obstruct the measurement. As shown in FIG. 4(b), light 3 is emitted so that a slit image 5 is formed at a position away from the slit substrate 1, and measurements are performed as moving the mask M in the arrow direction. No height-direction position measurement is performed during exposure, and also the exposure position and the height-direction measurement position are different, thus its correction is necessary. As the correction method, the methods explained in the first embodiment and the second embodiment can be utilized appropriately.

In this embodiment, even if measurements are performed while moving the measurement device, the mask M surface above the slit substrate 1 cannot be measured. Therefore, in the measurement, the mask M needs to be moved to perform measurements.

In the above embodiments, adopted as a method to measure the height-direction measurement position of a mask surface is a method in which light is allowed to be obliquely incident onto the mask surface, and the position the light hits on the mask surface is measured by an imaging device which is in a different direction from a light source. However, if it is a method which can measure the height-direction position of a mask surface, other optical measurement methods, moreover other methods such as a method utilizing variation in electrostatic capacity and a method utilizing variation in eddy current can be used arbitrarily.

Furthermore, if it can be assumed that mask surface roughness is not a serious problem, and that the mask position to attach onto a mask stage does not change from one mask to another, in place of directly measuring the height-direction position of the mask, the height-direction position of the mask stage may be measured, in which case, the z-axis direction displacement of the mask stage MS by the height measurement device 14 in FIG. 2, and the height-direction position of the mask surface is computed from that value.

Also, in the above embodiments, explanations were given with a scan-type exposure device as an example in which both the mask and the wafer are relatively scanned. In a scan-type exposure device, other than the exposure area defining member 1, a movable blind which changes arbitrarily the lateral width of an opening 1a shown in FIG. 1 and a synchronous blind which prevents unnecessary exposure light from reaching the wafer surface by illuminating with exposure light to the outside of a light-shielding zone placed around the pattern region of a mask. The synchronous blind is moved to a specified position to shield exposure light during a period when a light flux is illuminating the light-shielding zone (region Mb in FIG. 1) in starting and finishing scan-direction exposure. Although light-shielding members such as those which are movable blind and synchronous blind also need to be moved if they obstruct the mask height measurement, because each of these light-shielding members is equipped with an actuator as described above, they can be moved by the actuator.

What claimed is:

1. A method of measuring the height-direction position of a mask surface in an exposure device, the exposure device being configured to emit light from a light source onto the mask and transfer a pattern on the mask onto a photosensitive substrate using a projection optical system, the method comprising:

placing an exposure area defining member at a height-direction measuring position, the height-direction measuring position being different from an exposure position, the exposure area defining member being placed between the mask and the projection optical system and the exposure area defining member defining a shape of the light incident on the photosensitive substrate at the time of exposure; and measuring the height-direction position of the mask surface.

2. The mask surface height-direction position measurement method described in claim 1 wherein the exposure area defining member is fixed in its position at the time of exposure.

3. The mask surface height-direction position measurement method described in claim 1 wherein the height-direction measuring position is at a position at which the exposure area defining member does not obstruct a mechanism of a height measurement device.

4. The mask surface height-direction position measurement method described in claim 3 wherein the mask surface height-direction position measurement is performed by intermittently changing the relative position between the mask and the exposure area defining member.

5. The mask surface height-direction position measurement method described in claim 4 wherein the exposure area defining member has an opening through which exposure light can pass, and the height-direction position measurement is performed through the opening.

6. The mask surface height-direction position measurement method described in claim 5, further comprising moving a mask stage which supports the mask while measuring the height-direction position of the mask.

7. The mask surface height-direction position measurement method described in claim 1 wherein the exposure area defining member is a slit substrate.

8. The mask surface height-direction position measurement method described in claim 1 wherein the mask height-direction position measurement is performed using an optical measurement device having at least a measurement light source and a detector to detect a light flux which is emitted from the measurement light source and reflected by the mask.

9. The mask surface height-direction position measurement method described in claim 1, further comprising: measuring a height-direction position of a mask stage, and correcting the measured mask surface height-direction position with the measured mask stage height-direction position.

10. The mask surface height-direction position measurement method described in claim 1, further comprising returning the exposure area defining member to the exposure position which defines the exposure area at the time of exposure after measuring the mask surface height-direction position.

11. The mask surface height-direction position measurement method described in claim 1, further comprising the step of correcting the height-direction position of the mask, at the time of exposure, based on the measured height-direction position data of the mask surface.

12. The mask surface height-direction position measurement method described in claim 1, further comprising the step of correcting the height-direction position of the mask based on the measured height-direction position data of the mask surface. the time of exposure after measuring the mask surface height-direction position.

13. The mask surface height-direction position measurement method described in claim 1, further comprising measuring a height direction position of a pattern region of the mask.

14. The mask surface height-direction position measurement method described in claim 13, further comprising measuring a height direction position of a no pattern region of the mask, which surrounds a pattern region.

15. A method of measuring the height-direction position of a mask in an exposure device, the exposure device being configured to emit light from a light source onto the mask and transfer a pattern on the mask onto a photosensitive substrate using a projection optical system, the method comprising:

providing a mask stage height position measurement device to measure the height-direction position of a mask stage which holds the mask and to simultaneously measure the height-direction position of the mask surface.

16. The mask surface height-direction position measurement method described in claim 15, further comprising the step of correcting the height-direction position of the mask based on the height-direction position of the measured mask surface and the measured height-direction position of the mask stage at the time of exposure.

17. A method of measuring the height-direction position of a mask surface from a reference plane by a height measurement device in an exposure device, the exposure device being configured to emit light from a light source onto the mask and transfer a pattern on the mask onto a photosensitive substrate using a projection optical system, the method comprising:
provided an exposure area defining member for defining a shape of the light incident on the photosensitive substrate at the time of exposure, and
measuring the height-direction position of the mask surface at a position in which a height measurement device is not obstructed by the exposure area defining member, wherein the height-direction position of the mask surface is measured for an area of the mask surface that is greater than the shape defined by the exposure area defining member.

18. An exposure device for exposing a photosensitive substrate with a reflection mask pattern, comprising:
a projection optical system for projecting the reflection mask pattern, the projection optical system comprising an exposure area defining member for defining a shape of light incident on the photosensitive substrate,
a measurement means for measuring the height-direction position of the reflection mask, the measurement means comprising means for measuring the height-direction position of an area of the reflection mask that is greater than the area of the shape of light defined by the exposure area defining member,
a measurement means for measuring the height-direction position of the photosensitive substrate,
a means for adjusting the height-direction position of the reflection mask based on the measured height-direction position of the reflection mask, and
a means for adjusting the height-direction position of the photosensitive substrate based on the measured height-direction position of the photosensitive substrate.

19. An exposure device for exposing a mask with light emitted from a light source and for transferring a pattern formed on the mask onto a photosensitive substrate, comprising:
a projection optical system,
height-direction position measurement means for measuring the height-direction position of the mask,
an exposure area defining member between the mask and the projection optical system for defining a shape of the light incident on the photosensitive substrate at the time of exposure,
a movement means for moving the exposure area defining member, and
a control means for controlling the movement means so as to fix the exposure area defining member at a first position at the time of exposure and to move the exposure area defining member to a second position at the time of measuring the height-direction position.

20. A method of exposing a photosensitive substrate with a pattern on a mask, the method comprising:
placing an exposure area defining member at an exposure position, the exposure position being between the mask and the projection optical system, and the exposure area defining member defining a shape of light incident on the photosensitive substrate at the time of exposure;
moving the exposure area defining member from the exposure position to a height-direction measuring position;
measuring a height-direction position of the mask at the height-direction measuring position;
correcting the height-direction position of the mask based on the measured height-direction position data of the mask;
emitting light onto the mask in a corrected height-direction position; and
transferring the pattern on the mask to the photosensitive substrate.

\* \* \* \* \*

UNITED STATES PATENT AND TRADEMARK OFFICE
CERTIFICATE OF CORRECTION

| | |
|---|---|
| PATENT NO. | : 7,433,017 B2 |
| APPLICATION NO. | : 11/312389 |
| DATED | : October 7, 2008 |
| INVENTOR(S) | : Hirayanagi et al. |

Page 1 of 1

It is certified that error appears in the above-identified patent and that said Letters Patent is hereby corrected as shown below:

Title page, item (75), line 1, "Tokyo" should read --Suginami-ku--.

Title page, item (75), line 2, "Tokyo" should read --Saitama-city--.

Claim 12, column 14, lines 44-45, delete "the time of exposure after measuring the mask surface height-direction position.".

Signed and Sealed this

Third Day of August, 2010

David J. Kappos
*Director of the United States Patent and Trademark Office*